(12) United States Patent
Qin

(10) Patent No.: US 10,566,510 B2
(45) Date of Patent: Feb. 18, 2020

(54) PACKAGING FRAME AND MANUFACTURING METHOD OF PACKAGING FRAME

(71) Applicant: KAISTAR Lighting (Xiamen) Co., Ltd, Xiamen (CN)

(72) Inventor: Guoheng Qin, Xiamen (CN)

(73) Assignee: KAISTAR LIGHTING (XIAMEN) CO., LTD, Xiamen (CN)

( * ) Notice: Subject to any disclaimer, the term of this patent is extended or adjusted under 35 U.S.C. 154(b) by 0 days.

(21) Appl. No.: 16/133,649

(22) Filed: Sep. 17, 2018

(65) Prior Publication Data

US 2019/0103530 A1  Apr. 4, 2019

(30) Foreign Application Priority Data

Sep. 29, 2017 (CN) .......................... 2017 1 0912104

(51) Int. Cl.
    *H01L 33/60* (2010.01)
    *H01L 33/48* (2010.01)
    *H01L 33/62* (2010.01)

(52) U.S. Cl.
    CPC ............ *H01L 33/60* (2013.01); *H01L 33/486* (2013.01); *H01L 33/62* (2013.01); *H01L 2224/8385* (2013.01); *H01L 2933/0033* (2013.01); *H01L 2933/0058* (2013.01)

(58) Field of Classification Search
    CPC ....... H01L 33/486; H01L 33/60; H01L 33/62; H01L 2224/8385
    See application file for complete search history.

(56) References Cited

U.S. PATENT DOCUMENTS

| 2009/0315049 A1* | 12/2009 | Urasaki ................. H01L 33/486 257/98 |
| 2016/0272887 A1* | 9/2016 | Tao ........................ C04B 28/006 |
| 2018/0062048 A1* | 3/2018 | Qin ........................ H01L 33/486 |
| 2018/0086027 A1* | 3/2018 | Peres ..................... C04B 28/006 |
| 2019/0273188 A1* | 9/2019 | Kuramoto ............... H01L 33/62 |

FOREIGN PATENT DOCUMENTS

| CN | 1474951 A | 2/2004 |
| CN | 101252165 A | 8/2008 |
| CN | 102010570 A | 4/2011 |
| CN | 103474563 A | 12/2013 |

* cited by examiner

*Primary Examiner* — Joseph C. Nicely
(74) *Attorney, Agent, or Firm* — Hemisphere Law, PLLC; Zhigang Ma

(57) ABSTRACT

A packaging frame for a photoelectric device chip exemplarily includes a lead frame, an insulator and a reflector disposed on the lead frame and the insulator. The lead frame includes a positive electrode pad and a negative electrode pad. The insulator is disposed between the positive electrode pad and the negative electrode pad. The reflector is formed with a through hole to define regions where the lead frame and the insulator are located in the through hole as a die bonding region. The reflector is connected with the lead frame by a geological polymer. The geological polymer is employed as the material of the reflector owing to the excellent interfacial bonding performance with various materials, and a connector or a connective layer formed therefrom has good chemical and thermal stabilities, excellent airtightness, high mechanical strength and weathering resistance, which can significantly enhances adhesion and mounting stability of device.

17 Claims, 4 Drawing Sheets

ID TECHNICAL FIELD

The disclosure relates to the field of photoelectric technology, and more particularly to a packaging frame and a manufacturing method thereof, as well as an improved light emitter equipped with the packaging frame.

DESCRIPTION OF RELATED ART

A conventional light emitter (e.g. a LED light emitter) with a photoelectric device may include a packaging frame, and a photoelectric device chip as well as a lens disposed in the packaging frame.

The packaging frame specifically may include components such as a reflector, a substrate and a metal layer. The reflector, the substrate and the lens generally are bonded together by adhesive.

However, it has been pointed out that inherent characteristics of the adhesive also have influence on the utilization of the photoelectric device. For instance, an organic compound adhesive can easily be aged resulting from temperature or highly energetic wavebands, which obstructs a ceramic substrate from bonding with other components due to its high process temperature. Another example is that an alloy adhesive requests a corresponding soldering process and bonding interface, and huge characteristic differences of bonding interfaces would easily cause a connective structure to be unstable.

Therefore, novel materials are expected to be developed for applying in photoelectric devices and substituting or partially substituting components or connectors among components in the conventional light emitter, so that drawbacks of the conventional light emitter may be effectively overcome consequently.

SUMMARY

In order to solve the above issues, the disclosure uses a geological polymer to replace a conventional material of a reflector, or as a material of a connective layer between components in a packaging frame or a light emitter, In an embodiment, the packaging frame is configured (i.e., structured and arranged) for securing a photoelectric device chip(s). The packaging frame includes a lead frame, an insulator, and a reflector disposed on the lead frame and the insulator.

The lead frame includes a positive electrode pad and a negative electrode pad.

The insulator is disposed between the positive electrode pad and the negative electrode pad.

The reflector is formed with a through hole to define regions where the lead frame and the insulator are located in the through hole as a die bonding region. The reflector is connected with the lead frame by a connector, and the connector is made of a geological polymer.

The disclosure further provides another packaging frame configured for securing a photoelectric device chip(s). The packaging frame includes a substrate, a metal layer disposed on the substrate, and a reflector disposed on the substrate and the metal layer.

The metal layer includes a positive section and a negative section spaced apart.

The reflector is formed with a through hole to define regions where the metal layer and the substrate are located in as a die bonding region. The reflector is connected with the substrate by a connector, and the connector is made of a geological polymer.

The disclosure further provides a light emitter equipped with the above packaging frame. In particular, the light emitter includes: at least one photoelectric device chip, a lens, and the above packaging frame. The at least one photoelectric device chip is arranged in the die bonding region of the packaging frame and electrically connected with the metal layer on the packaging frame. The lens is located above the at least one photoelectric device chip and disposed on the packaging frame.

The disclosure further provides a manufacturing method of a reflector. The manufacturing method includes following steps of: providing mixed powders whose principal raw materials are mineral powders with silicon oxygen tetrahedron and aluminum oxygen tetrahedron, adding an alkali activator into the mixed powders to form a slurry with fluidic and thixotropic properties, and disposing the slurry in a predetermined position of the packaging frame to react and solidify and thereby forming the geological polymer.

Benefits are that: the disclosure introduces the geological polymer as materials of the LED packaging frame and the connector (or the connective layer) of the packaging frame, and utilizes the fluidic and thixotropic characteristics of an intermediate of the geological polymer to improve the operation of preparation process; moreover, the intermediate of the geological polymer can be solidified/hardened at room temperature and has excellent interface bonding performances with materials such as metal, glass and ceramic. The generated geological polymer has good chemical and thermal stabilities, excellent airtightness, high mechanical strength and good weathering resistance, and thus can significantly enhance adhesion and mounting stability of device.

DETAILED DESCRIPTION OF EMBODIMENTS

The disclosure will now be described in detail with reference to some embodiments as follows.

First Embodiment

Figure 1A:
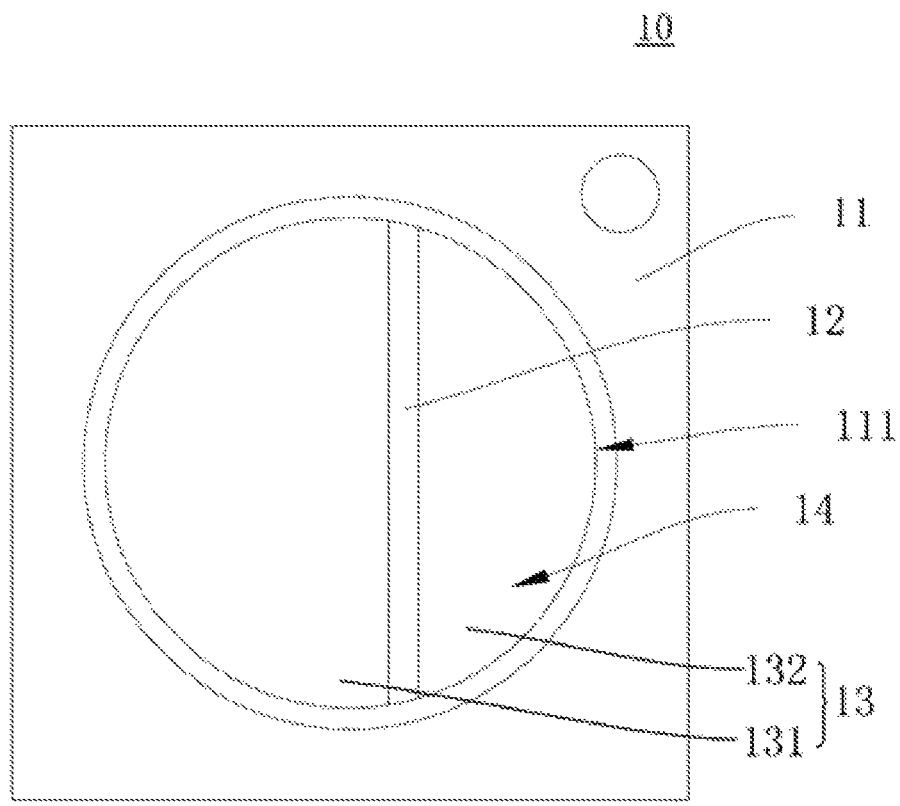
FIG. 1a a top structural schematic view of a packaging frame of a first embodiment of the disclosure.
Figure 1B:
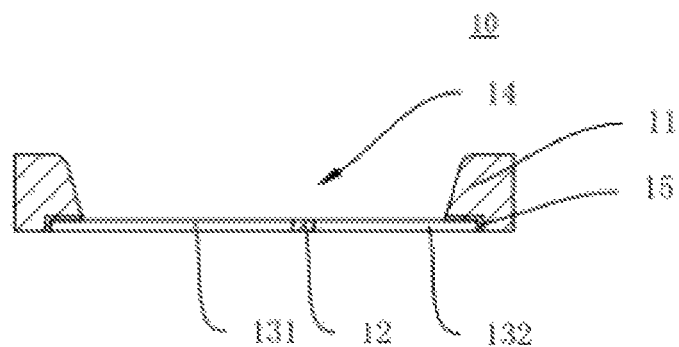
FIG. 1b is a cross-sectional, structural schematic view of the packaging frame of the first embodiment of the disclosure.

As shown in FIG. 1a and FIG. 1b, the embodiment provides a packaging frame 10 configured for securing a photoelectric device chip(s) (not shown). The packaging frame 10 includes a reflector 11, an insulator 12, and a lead frame 13.

Specifically, the lead frame 13 is exemplarily made of a copper based material with enough rigidity, and a major function of it is to provide support and electrical connection for the photoelectric device chip(s) secured thereon. In general, in order to secure the photoelectric device chip(s) on the lead frame 13, a surface of the lead frame 13 usually is plated with a silver reflective layer or the like. The lead frame 13 of an exemplary embodiment includes a positive electrode pad 131 and a negative electrode pad 132. The insulator 12 is disposed, between the positive electrode pad 131 and the negative electrode pad 132 to separate the positive electrode pad 131 from the negative electrode pad 132.

The reflector 11 is correspondingly disposed on the lead frame 13 and the insulator 12. The reflector 11 is formed with a through hole 111 to expose parts of the lead frame 13 and insulator 12. The partial regions of the lead frame 13 and the insulator 12 bounded by the through hole 111 are defined as a die bonding region 14, and the photoelectric device chip(s) will be mounted in the die bonding region 14. Optionally, a shape of the through hole 111 can be round, rectangular or other shape, which will not be limited by the disclosure.

Specifically, the reflector 11 is attached to the lead frame 13 by a connector 15, and the connector 15 is made of a geological polymer. For the purpose of stabilizing the structure, the reflector 11 is optionally to cover entire lateral sides and a top surface of the lead frame 13 but exposes the die bonding region 14 defined by the through hole 111. In a preferred embodiment, the reflector 11 and the connector 15 are an integral structure (i.e., generally integrally formed), and a material of which is the geological polymer. Optionally, a material of the insulator 12 also can be the geological polymer, and thus in a practical manufacturing process, the reflector 11, the connector 15 and the insulator 12 can be integrally formed in a same process to connect with the lead frame 13 and thereby form the packaging frame. In another embodiment, the reflector and the connector can be individually formed, for instance, the material of the reflector can be metal instead, and a connector made of the geological polymer ties, the lead frame and electrically isolates the metal reflector from the lead frame, but the disclosure is not limited to this.

Usually, the reflector can be made of silicone resin, epoxy resin, metal or the like; and the lead frame generally is made of metal. Characteristic diversities among different materials demand various adhesives to cohere the reflector and the lead frame, which are not beneficial for diversification of products. The exemplary embodiment employs the geological polymer as the connector, and the geological polymer has excellent interface bonding performance for many kinds of materials and thus can realize mutual connections of different kinds of materials, thereby facilitating the realization of diversified products. Moreover, in an embodiment, the reflector 11 is formed by the geological polymer; on one hand, the geological polymer as an inorganic nonmetallic material has excellent performances analogous to those of ceramic, such as excellent chemical and thermal stabilities, high strength, good airtightness and good insulating property; and on the other hand, the geological polymer is an air-hardening cementitious material and can be fainted in room temperature. The intermediate of the geological polymer can be formed to be various special-shaped structures at room temperature with its fluidity and thixotropy in an initial state, and meanwhile effective interfacial bonding with multiple materials such as metal, ceramic and glass at room temperature can be achieved.

The geological polymer is exemplarily formed by polymerization reaction of raw materials with silicon oxygen tetrahedron and aluminum oxygen tetrahedron structures activated by alkali solution, its chemical formula is $M_n[(SiO_2)_z AlO_2]_n \cdot wH_2O$, where n is a degree of polymerization; z is a mole ratio of silicon to aluminum and whose value may be 1, 2 or 3; M is a metal ion; w is the number of bound-water. A person skilled in the art can understand that the geological polymer is a mixture, which may include molecules with different degrees of polymerization or water contents, as well as some intermediate of geological polymer failed to be polymerized at a stage of alkali activating.

Preferably, the geological polymer of an exemplary embodiment can use mineral powders with silicon oxygen tetrahedron and aluminum oxygen tetrahedron calcined in certain temperature as a principal raw material, such as kaolin, metakaolin or a mixture of them; or use other powders with active silicon oxygen tetrahedron and aluminum oxygen tetrahedron as the principal raw material, such as synthesized raw material powders or industrial tailings of partially calcined products.

The principal raw materials in one aspect provide the active silicon oxygen tetrahedron and active aluminum oxygen tetrahedron for forming a principal structure of the geological polymer, and in another aspect the principal raw material can obtain a slurry with fluidic and thixotropic properties after being mixed with alkali activator. In the progress of a chemical reaction, the slurry gradually turns to be the geological polymer with high strength and high density (e.g. a three-dimensional polymerized aluminate structure), which is a main skeleton structure of the reflector 11.

In order to make the generated geological polymer to meet the requirement of LED packaging frame, especially eligible for the reflector, a partical size of the principal material is preferred to be in a range of 3 μm~45 μm; powders of raw materials may suffer aggregation issue if the partical size is excessively small, and density of the generated geological polymer may be low if the partical size is excessively large. Both situations would significantly influence reflection performance of the reflector made of the geological polymer.

Taking a LED light emitter as an example, according to requirements of different LED wavebands, the principal raw material further is mixed with corresponding auxiliary materials, e.g., reflective powders, so as to improve the reflectivity of the reflector in a corresponding waveband. For instance, aiming at visible light or infrared waveband, reflective powders with high reflectivity In the visible light or infrared waveband such as titanium oxide ($TiO_2$), aluminum oxide ($Al_2O_3$), barium titanate ($BaTiO_4$), barium sulfate ($BaSO_4$), etc., can be added therein. Aiming at near ultraviolet or deep ultraviolet waveband, reflective powders with high reflectivity in ultraviolet waveband such as calcium carbonate ($CaCO_3$), $BaSO_4$ and so on can be added in. It is preferred that partical size of the added, reflective powders primarily is in a range of 1 μm~35 μm. A weight ratio of the reflective powders in the mixture of powders is preferable to be in a range of 1.5%~25%.

Figure 2:
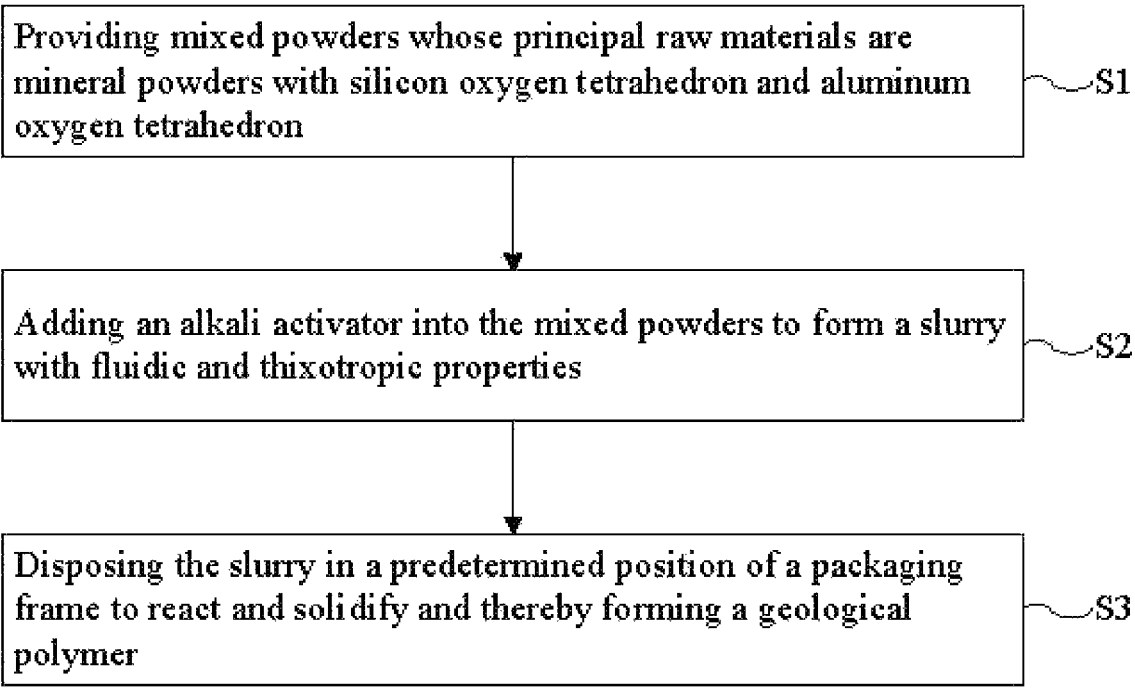
FIG. 2 is a flowchart of a manufacturing method of the packaging frame in the first embodiment of the disclosure.

As shown in FIG. 2, an exemplary embodiment provides a manufacturing method of the geological polymer reflector of aforementioned LED light emitter, and the manufacturing method includes following steps.

Step S1, providing calcined mineral powders with silicon oxygen tetrahedron and aluminum oxygen tetrahedron as a principal raw material of the reflector and/or an insulator of a packaging frame. In an, exemplary embodiment, the principal raw material may be kaolin, whose crystalline chemical formula can be $2SiO_2 \cdot Al_2O_3 \cdot 2H_2O$, and a theoretical chemical composition includes 46.54% $SiO_2$, 39.5% $Al_2O_3$ and 13.96% $H_2O$. The kaolin mineral is a 1:1 typed phyllosilicate.

Optionally, adding reflective powders into the principal raw material to form mixed powders, in order to improve the reflective performance of the reflector in different wavebands. $BaTiO_3$ and $TiO_2$ powders with high reflectivity in visible light and infrared wavebands can be used as reflective powders in an exemplary embodiment, and a mass ratio of the reflective powders in the mixed powders is in a range of 1.5%~25.0%.

Step S2, adding an alkali activator into the mixed powders. The alkali activator can be mixed with the principal raw material to folio a slurry with certain fluidity and thixotropy. The slurry changes with the chemical reaction going on. In this step, the alkali activator can be NaOH solution, KOH solution or a mixed solution of them, which is fairly stirred to evenly mixed with the principal raw material. Optionally, a pH value of NaOH solution or KOH solution is preferably restricted to be in a range of 11~14, and a solid content of the mixed slurry is in a range of 75%~92%(wt %).

Optionally, adding a certain amount of silicates ($Na_2O \cdot nSiO_2$ and $K_2O \cdot nSiO_2$) into the mixed powders simultaneously to increase strength of the geological polymer. A modulus of the silicates preferably is in a range of 1.0~2.3.

As soon as the alkali activator is added into the mixed powders, the principal raw material chemically reacts with the alkali activator to gradually form the intermediate of geological polymer. The chemical reaction can be shown as the equation (1).

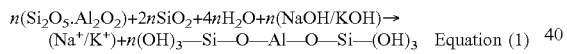

$n(Si_2O_5 \cdot Al_2O_3) + 2nSiO_2 + 4nH_2O + n(NaOH/KOH) \rightarrow$
$(Na^+/K^+) + n(OH)_3—Si—O—Al—O—Si—(OH)_3$  Equation (1)

The substance on the right side of the equation (1) is the intermediate of geological polymer.

Step S3, following the reacting process in step S2, pouring/injecting fluidic slurry of reactants into a predetermined position of the packaging frame to react and solidify and thereby forming a particular structure made of a geological polymer. Specifically, along with the chemical reaction of the principal raw material and the alkali activator as shown in equation (1), the intermediate of geological polymer in the equation (1) will further undergo a polymerization reaction as shown in equation (2).

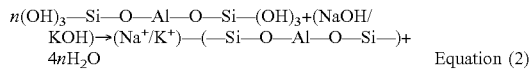

$n(OH)_3—Si—O—Al—O—Si—(OH)_3 + (NaOH/$
$KOH) \rightarrow (Na^+/K^+)—(—Si—O—Al—O—Si—)— +$
$4nH_2O$  Equation (2)

The substance on the left side of the equation (2) is the intermediate of geological polymer, and the substance on the right side of the equation (2) is the geological polymer.

With the progress of equation (2), the intermediate of geological polymer is gradually consumed to generate stable three-dimensional polymerized aluminate structures for sustaining equation (1). The continue broken of Si—O bonds and Al—O bonds in the intermediate of geological polymer make the original structure be disintegrated, simultaneously interwove and polymerized to form a disordered gel, material structure, i.e., the geological polymer. As the proceeding of reaction, the mechanical strength of the intermediate of geological polymer is unceasingly raised, eventually forming geological polymer with high strength and density.

In an embodiment, the fluidic reactant slurry can be injected between the reflector 11 and the lead frame 13 to react and solidify and thereby form a connector 15. In another embodiment, the fluidic reactant slurry can be injected in a prepared mold. Specifically, the prepared mold can be a mold of the reflector, and the mold is disposed correspondingly as per a connection relationship between the reflector and the lead frame to enable the reflector formed in the mold to be immediately connected with the lead frame 13; that is, the reflector 11 and the connector 15 can be integrally formed to connect with the lead frame 13. In other words, the mold may have a cavity with a shape same as that of the packaging frame 10 and thus can hold the lead frame 13 therein. In still another embodiment, an insulator 12 between the positive electrode pad 131 and the negative electrode 132 can be integrally foliated with the reflector 11 and the connector 15 in the same manner. Finally, the reflector 11 is demolded and post-processed according to design requirements, such as cleansing, electroplating, chemical plating, evaporative plating or other surface treatments and processes, for completing the manufacture of the LED packaging frame 10.

The above exemplary embodiment introduces the geological polymer as the materials of the reflector and the insulator of the LED packaging frame, which utilizes the fluidic and thixotropic characteristics of the intermediate of geological polymer to improve the operation of preparation process. Moreover, the intermediate can be solidified/hardened at room temperature to form the reflector or insulator made of the geological polymer with high chemical and thermal stabilities, as well as excellent airtightness and high mechanical strength. The geological polymer has excellent interface bonding performance with materials such as metal, glass and ceramic, and therefore can significantly improve adhesion or mounting stability.

Second Embodiment

The second embodiment provides a light emitter.

Figure 3A:
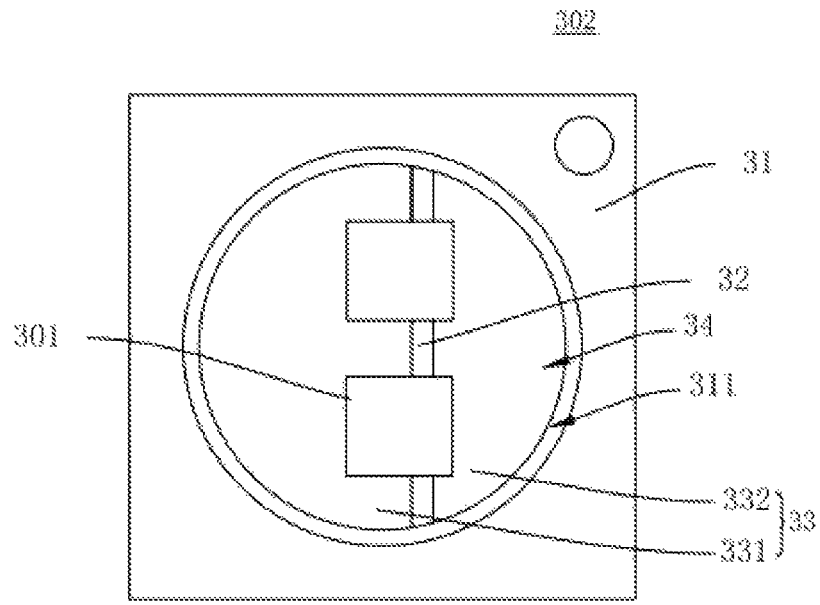
FIG. 3a is a top structural schematic view of a light emitter of a second embodiment of the disclosure.
Figure 3B:
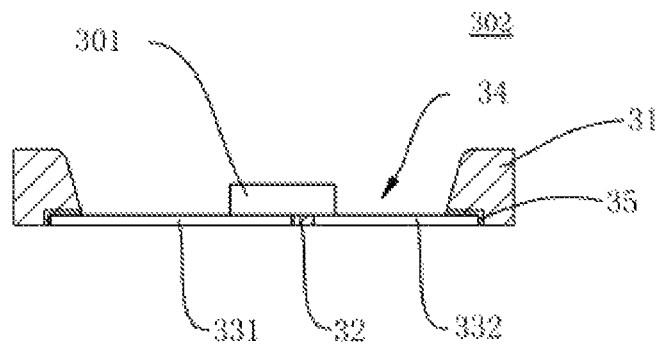
FIG. 3b is a cross-sectional structural schematic view of the light emitter of the second embodiment of the disclosure.

As shown in FIG. 3a and FIG. 3b, a light emitter 302 of the illustrated embodiment includes at least one photoelectric device chip 301 and a packaging frame.

The packaging frame includes a reflector 31, an insulator 32 and a lead frame 33.

Specifically, a copper based material with enough rigidity is a dominative material of the lead frame 33. A major function of the lead frame 33 is to provide a platform and electrical connection for the photoelectric device chips 301 mounted thereon. In general, a surface of the lead frame 33 is plated with a silver reflective layer, in order to mount the at least one photoelectric device chip 301 such as LED chips on the lead frame 33.

The lead frame 33 of an exemplary embodiment includes a positive electrode pad 331 and a negative electrode pad 332. The insulator 32 is disposed between the positive electrode pad 331 and the negative electrode pad 332 to separate the positive electrode pad 331 from the negative electrode pad 332. FIG. 3a and FIG. 3b illustrate that two photoelectric device chips 301 are mounted on the positive electrode pad 331 and the negative electrode pad 332 in a flip-chip manner; the photoelectric device chips may be regular chips (e.g., face-up chips) disposed on the die bonding region and electrically connect to the positive electrode pad 331 and the negative electrode pad 332 by wire bonding instead. The number/amount of the photoelectric device chips will not be restricted by the illustrated embodiment.

The reflector 31 is correspondingly disposed on the lead frame 33 and the insulator 32. The reflector 31 is defined with a through hole 311 to expose parts of the lead frame 33 and insulator 32. The partial regions of the lead frame 33 and the insulator 32 bounded by the through hole 311 are defined as a die bonding region 34, and the photoelectric device chips 301 are mounted in the die bonding region 34.

Specifically, the reflector 31 is attached to the lead frame 33 by a connector 35, and the connector is made of a geological polymer. For the purpose of stabilizing the structure, the reflector 31 is optionally to cover entire lateral sides and a top surface of the lead frame 33 but exposes the die bonding region 34 bounded by the through hole 311. In an exemplary embodiment, the reflector 31 and the connector 35 are preferably an integral structure (i.e., generally integrally formed), and a material of which is the geological polymer. Optionally, the material of the insulator 32 also can be the geological polymer. In a practical manufacturing process, the reflector 31, the insulator 32 and the lead frame 33 can be integrally formed in a same injection molding process to connect together and thereby form the packaging, frame. In another embodiment, the reflector and the connector can be individually formed, for instance, the material of the reflector can be metal, and the geological polymer as a connector ties the lead frame, but the disclosure is not limited to this.

The reflector 31 is formed by the geological polymer in the illustrated embodiment, on one hand, the geological polymer is a sort of inorganic non-metallic material, which owns excellent performances analogous to those of ceramic, such as excellent chemical and thermal stabilities, high strength, excellent, airtightness and good insulating property, and on the other hand, the geological polymer is an air-hardening cementitious material and can be formed at room temperature. The intermediate of the geological polymer can be fainted to be various special-shaped structures at room temperature with its fluidity and thixotropy in an initial state, and meanwhile effective interfacial bonding with multiple materials such as metal, ceramic and glass at room temperature can be achieved.

In another embodiment, the reflector and/or the insulator can be adhered to the connecting interface(s) of the lead frame by the geological polymer.

The geological polymer may be formed by polymerization reaction of raw materials with silicon oxygen tetrahedron and aluminum oxygen tetrahedron structures activated by alkali solution, its chemical formula is $M_n[(SiO_2)_z AlO_2]_n \cdot wH_2O$, where n is the degree of polymerization; z is a mole ratio of silicon to aluminum and whose value can be 1, 2 or 3; M is a metal ion, w is the number of bound-water.

Preferably, the geological polymer of an exemplary embodiment uses mineral powders with silicon oxygen tetrahedron and aluminum oxygen tetrahedron calcined in certain, temperature as a principal raw material, such as kaolin, metakaolin or the mixture of them; or uses other powders with active silicon oxygen tetrahedron and aluminum oxygen tetrahedron as the principal material, such as synthesized raw material powders or industrial tailings of partially calcined products.

The above principal raw material in one aspect provides the active silicon oxygen tetrahedron and active aluminum oxygen tetrahedron for forming a principal structure of the geological polymer, and in another aspect the principal raw material can obtain a slurry with fluidic and thixotropic properties after being mixed with alkali activator. In the progress of a chemical reaction, the slurry gradually changes to be the geological polymer with high strength and high density (e.g. a three-dimensional polymerized aluminate structure), which is a major skeleton structure of the reflector 31.

Partical sizes of the principal raw material are mostly in a range of 3 μm~45 μm, in order to optimize performances of the geological polymer.

Taking the LED light emitter 302 as an example, according to requirements of different LED wavebands, the principal raw material further is mixed with corresponding auxiliary materials, e.g., reflective powders, so as to improve the reflectivity of the reflector 31 in a corresponding waveband. For instance, aiming at visible light or infrared waveband, reflective powders with high reflectivity in the visible light or infrared waveband, such as $TiO_2$, $Al_2O_3$, $BaTiO_4$, $BaSO_4$, etc., can be added in. Aiming at near ultraviolet or deep ultraviolet waveband, reflective powders with high reflectivity in ultraviolet waveband such as $CaCO_3$, $BaSO_4$ and so on can be added in. It is preferred that partical sizes of the added reflective powders primarily are in a range of 1 μm~35 μm. A weight ratio of the reflective powders in the mixture of powders is preferable to be in a range of 1.5%~25%.

Analogously to the first embodiment, the geological polymer can further be mixed with auxiliary materials, such as a silicate(s) or the like. The added amount and functions can refer to the first embodiment, and thus will not be repeated herein.

The light emitter 302 of the illustrated embodiment replaces conventional material(s) of the reflector 31 and/or the insulator 32 as the geological polymer, so that connections among the reflector 31, the insulator 32 and other component(s) become more stable and reliable.

Third Embodiment

Figure 4A:
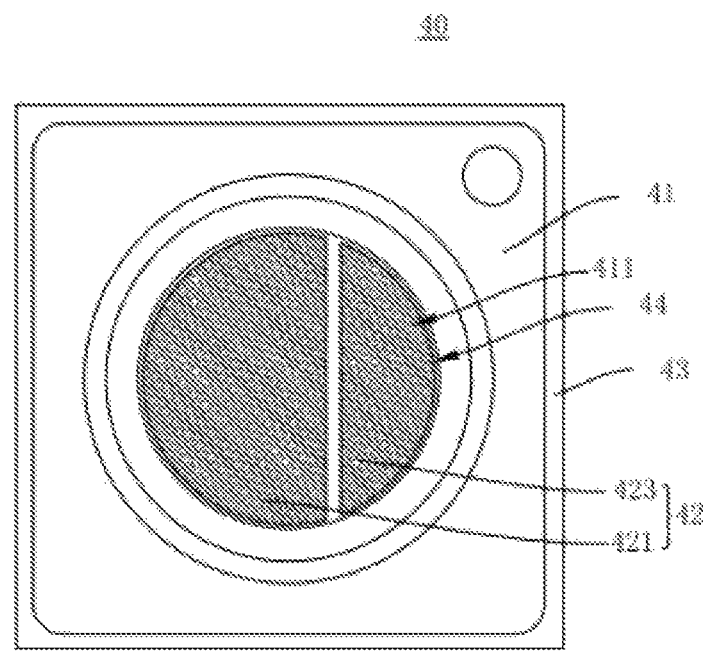
FIG. 4a is a top structural schematic view of a packaging frame of a third embodiment of the disclosure.
Figure 4B:
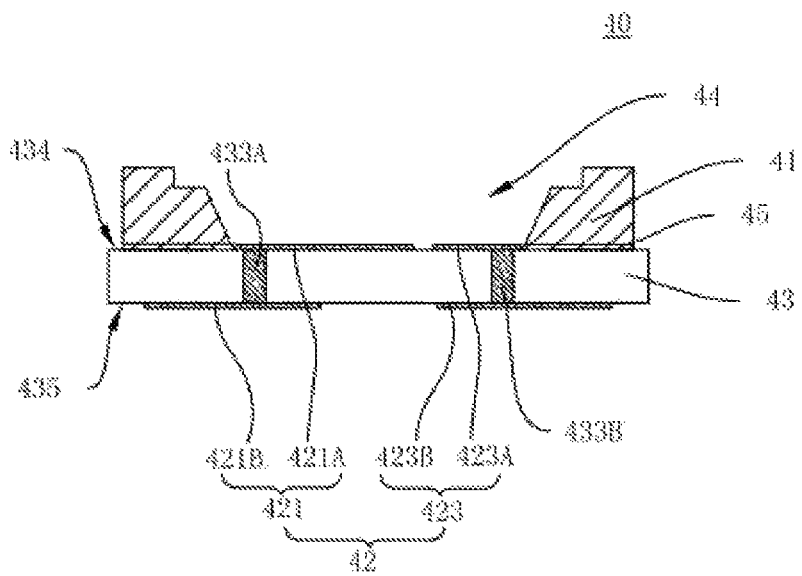
FIG. 4b is a cross-sectional structural schematic view of the packaging frame of the third embodiment of the disclosure.

As shown in FIG. 4a and FIG. 4b, the third embodiment provides another packaging frame 40 configured for mounting a photoelectric device chip(s) (not shown) thereon. The packaging frame 40 includes a reflector 41, a metal layer 42 and a substrate 43.

The substrate 43 can be made of ceramic or other insulating material. The substrate 43 has a first surface 434 and a second surface 435 opposite to the first surface 434. The substrate 43 is further defined with multiple through holes 433A, 433B. The first surface 434 and the second surface 435 are communicated by the through holes 433A, 433B.

Furthermore, the metal layer 42 is disposed on the substrate 43, and the metal layer 42 includes a positive section 421 and a negative section 423 spaced apart. Specifically, the positive section 421 includes a first metal section 421A disposed on the first surface 434 and a second metal section 421B disposed on the second surface 435. The first metal section 421A and the second metal section 421B are communicated by the through hole 433A. The negative section 423 includes a third metal section 423A disposed on the first surface 434 and a fourth metal section 423B disposed on the second surface 435. The third metal section 423A and the fourth metal section 423B are communicated by the other through hole 433B. The first metal section 421A and the third metal section 423A are spaced apart. The second metal section 421B and the fourth metal section 423B are spaced apart. As a result, the positive section 421 and the negative section 423 are mutually spaced apart.

The reflector 41 is correspondingly disposed on the substrate 43 and the metal layer 42. The reflector 41 is defined with a through hole 411 to expose parts of the substrate 43 and metal layer 42. The partial regions of the substrate 43 and the metal layer 42 bounded by the through hole 411 are defined as a die bonding region 44, and the photoelectric device chip(s) (not shown) is/are mounted in the die bonding region 44.

The reflector 41 can be attached to the substrate 43 by a connector 45, and the connector is made of a geological polymer. For the purpose of stabilizing the structure, the reflector 41 can be ring-shaped to cover a surface of the substrate 43 but exposes the die bonding region 44 bounded by the through hole 411. In a practical operation, the reflector 41 can be merely formed on the substrate 43, or partially formed on the metal layer 42, which will not be limited in the illustrated embodiment. In a preferred embodiment, the reflector 41 is made of a metal, which has excellent reflective performance, but the reflector 41 must be thoroughly electrically insulated from the metal layer 42, and the connector 45 made of the geological polymer is excellent in insulation and thus can be disposed between the reflector 41 and the metal layer 42 to securely connect the metal reflector 41 with the metal layer 42, as well as ensure the insulation therebetween, and further convenient for fabricating the packaging frame. In another embodiment, the reflector 41 and the connector 35 can be an integral structure (i.e., generally integrally formed), and the material of which is the geological polymer. Or, the reflector 41 may be made of other material and is connected with the substrate 43 and the metal layer 42 by the connector 45 made of the geological polymer.

The geological polymer is exemplarily formed by polymerization reaction of raw materials with silicon oxygen tetrahedron and aluminum oxygen tetrahedron structures activated by alkali solution, its chemical formula is $M_n[(SiO_2)_z AlO_2]_n \cdot wH_2O$, where n is the degree of polymerization; z is a mole ratio of silicon to aluminum and whose value may be 1, 2 or 3; M is a metal ion; w is the number of bound-water.

Preferably, the geological polymer of an exemplary embodiment employs mineral powders with silicon oxygen tetrahedron and aluminum oxygen tetrahedron calcined in certain temperature as a principal raw material, such as kaolin, metakaolin or the mixture of them; or employs other powders with active silicon oxygen tetrahedron and aluminum oxygen tetrahedron as the principal material, such as synthesized raw material powders or industrial tailings of partially calcined products.

The above principal raw material in one aspect provides the active silicon oxygen tetrahedron and active aluminum oxygen tetrahedron for forming a principal structure of the geological polymer, and in another aspect the principal raw material can obtain a slurry with fluidic and thixotropic properties after being mixed with an alkali activator. In the progress of a chemical reaction, the slurry gradually turns to be the geological polymer with high strength and high density (e.g. a three-dimensional polymerized aluminate structure), which is a major skeleton structure of the reflector 41.

In order to optimize performances of the geological, polymer, it is preferred that partical sizes of the principal material are mostly in a range of 3 μm~45 μm.

Taking a LED light emitter as an example, according to requirements of different LED wavebands, the principal raw material further is mixed with corresponding auxiliary materials e.g., reflective powders, so as to improve the reflectivity of the reflector in a corresponding waveband. For instance, aiming at visible light or infrared waveband, reflective powders with high reflectivity in the visible light or infrared waveband such as $TiO_2$, $Al_2O_3$, $BaTiO_4$, $BaSO_4$, etc., can be added in. Aiming at near ultraviolet or deep ultraviolet waveband, reflective powders with high reflectivity in ultraviolet wavebands such as $CaCO_3$, $BaSO_4$, etc., can be added in. It is preferred that partical sizes of added reflective powders primarily are in, a range of 1 μm~35 μm. A weight ratio of the reflective powders in the mixture of powders is preferable to be in a range of 1.5%~25%.

An exemplary embodiment further provides a manufacturing method of the reflector, which can be referred to FIG. 2 of the first embodiment, and a difference is that the lead frame in step S3 should be replaced by the substrate 43 equipped with the metal layer 42, and the other steps can refer to the first embodiment.

The embodiment introduces the geological polymer as, the material of the reflector of the LED packaging frame, and utilizes the fluidic and thixotropic characteristics of the intermediate of geological polymer to improve the operation of manufacturing process. Moreover, the intermediate can be solidified/hardened at room temperature to form the reflector made of the geological polymer with high chemical and thermal stabilities, as well as excellent airtightness and high mechanical strength. The geological polymer has excellent interface bonding performance with materials such as metal, glass and ceramic, and therefore can significantly improve adhesion or mounting stability.

Fourth Embodiment

Figure 5:
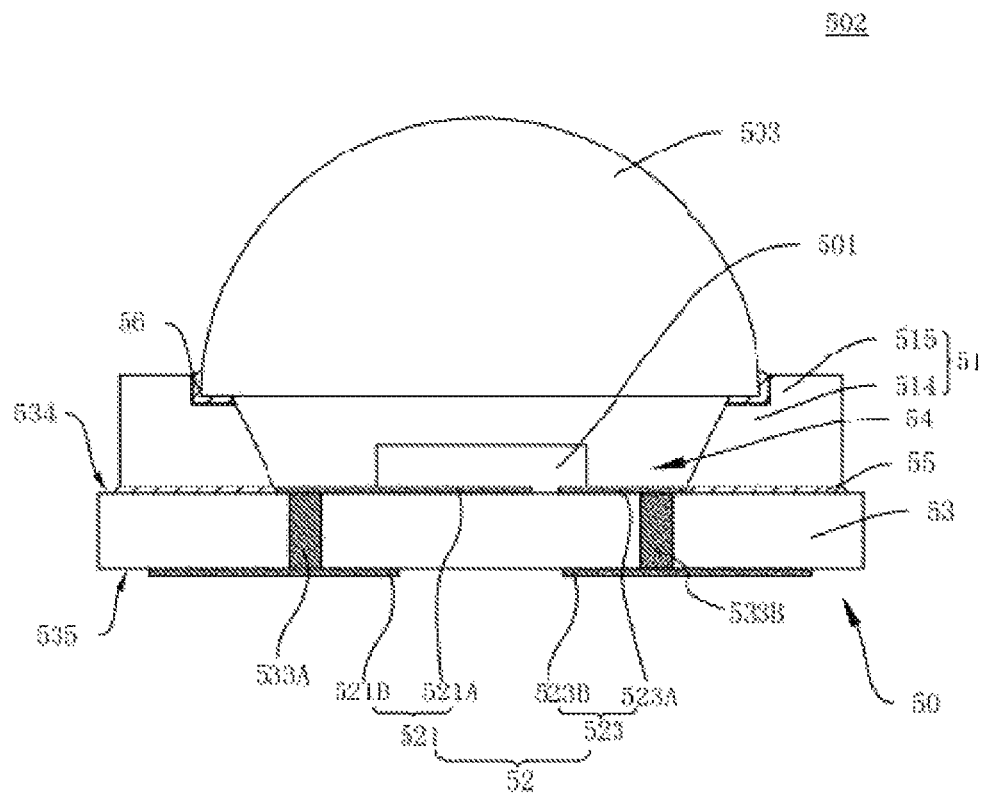
FIG. 5 is a structural schematic view of a light emitter of a fourth embodiment of the disclosure.

As shown in FIG. 5, the fourth embodiment provides another light emitter 502 including: at least one photoelectric device chip 501, a lens 503, and a packaging frame 50.

The packaging frame 50 includes a substrate 53 a metal layer 52 and a reflector 51.

The substrate 53 can be made of ceramic or other insulating material. The substrate 53 has a first surface 534 and a second surface 535 opposite to the first surface 534. The substrate 53 is further defined with numerous through holes 533A, 533B. The first surface 534 and the second surface 535 are communicated by the numerous through holes 533A, 533B.

Furthermore, the metal layer 52 is disposed on the substrate 53 and the metal layer 52 includes a positive section 521 and a negative section 523 spaced apart. Specifically, the positive section 521 includes a first metal section 521A disposed on the first surface 534 and a second metal section 521B disposed on the second surface 535; the first metal section 521A and the second metal section 521B are communicated by the through hole 533A. The negative section 523 includes a third metal section 523A disposed on the first surface 534 and a fourth metal section 523B disposed on the second surface 535; the third metal section 523A and the fourth metal section 523B are communicated by the other through hole 533B. The first metal section 521A and the third metal section 523A are spaced apart; the second metal section 521B and the fourth metal section 523B are spaced apart. As a result, the positive section 521 and the negative section 523 are mutually spaced apart.

The reflector 51 is correspondingly disposed on the substrate 53 and the metal layer 52. The reflector 51 is defined with a through hole to expose parts of the substrate 53 and metal layer 52. The partial regions of the substrate 53 and the metal layer 52 bounded by the through hole are defined as a die bonding region 54, and a photoelectric device chip(s) 501 is/are mounted in the die bonding region 54.

A connector 55 can be disposed between the reflector 51 and the substrate 53 in the illustrated embodiment. Optionally, a material the connector 55 can be a geological polymer. If the reflector 51 is made of a metal, the connector 55 is required to be disposed on connecting interfaces of the entire reflector 51 with the substrate 53 as well as the metal layer 52, so as to guarantee electrical insulation between the reflector 51 and the metal layer 52. Of course, the material of the reflector may be the geological polymer instead, and at this situation the reflector and the connector can be integrally formed.

Optionally, a top portion of the reflector 51 can be formed with a supporting platform 514. An external wall of the reflector 51 upwardly extends along a direction facing away from the die bonding region 54 to form a convex platform 515. The convex platform 515 is protruded from the supporting platform 514 and with the supporting platform 514 together to faint a stair-shaped reflector 51.

The lens 503 is mounted on the supporting platform 514 by connective layer 56 and surrounded by the convex platform 515. The supporting platform 514 and the convex platform 515 together give a position-limiting to the lens 503.

Preferably, a material of the connective layer 56 is the geological polymer, and the connective layer 56 can significantly improve stability of connection between the lens 503 and the reflector 51. Moreover, in a practical operation, the geological polymer as a connecting material can achieve mutual connections among various structures such as the substrate, the reflector and the lens, as well as among, various materials, so that it can bring visible convenience for the fabrication.

It should be understood that, referring to the first embodiment, the second embodiment and the third embodiment, the material of the reflector may be the geological polymer instead, and at this situation the connector or the integrally formed reflector and connector will be unnecessary, the manufacturing method illustrated in the first embodiment may be adopted to make the reflector 51 directly connect with the substrate 53 and the lens 503.

The illustrated embodiment utilizes the geological polymer to replace the conventional material of the reflector, and/or replace the conventional adhesive material between connecting interfaces of the component(s) and the reflector, which allows the connection between the reflector and other component to be more stable and reliable. Moreover, connections in the entire light emitter 502 can be achieved by the same material and thus the process is simple and convenient.

The aforementioned embodiments merely are for illustrating methods of the disclosure and the core ideology thereof; meanwhile, a person skilled in the art can made some modification on the basis of the concrete embodiments and the applicable scope according to the spirit of the disclosure. Overall the specification should not be regarded as the limiting of the instant application, and the protection scope of the application should be based on the attached claims therewith.

What is claimed is:

1. A packaging frame configured for securing a photoelectric device chip, wherein the packaging frame comprises:
   a lead frame, comprising a positive electrode pad and a negative electrode pad;
   an insulator, disposed between the positive electrode pad and the negative electrode pad; and
   a reflector, disposed on the lead frame and the insulator; wherein the reflector is fainted with a through hole to define regions where the lead frame and the insulator are located in the through hole as a die bonding region, the reflector is connected with the lead frame by a connector, and the connector is made of geological polymer.

2. The packaging frame according to claim 1, wherein the reflector is made of geological polymer.

3. The packaging frame according to claim 2, wherein the reflector further comprises reflective powders evenly distributed in geological polymer.

4. The packaging frame according to claim 3, wherein the reflective powders comprise at least one of titanium oxide, aluminum oxide, barium titanate, barium sulfate and calcium carbonate.

5. The packaging frame according to claim 3, wherein partical size of the reflective powders is in a range of 1 µm~35 µm.

6. The packaging frame according to claim 1, wherein the insulator is made of geological polymer.

7. A packaging frame configured for securing a photoelectric device chip, the packaging frame comprising:
   a substrate;
   a metal layer, disposed on the substrate; wherein the metal layer comprises a positive section and a negative section spaced apart; and
   a reflector, disposed on the substrate and the metal layer; wherein the reflector is formed with a through hole to define regions where the metal layer and the substrate are located in the through hole as a die bonding region, the reflector is connected with the substrate by a connector, and the connector is made of geological polymer.

8. The packaging frame according to claim 7, wherein the reflector is made of geological polymer or metal.

9. The packaging frame according to claim 8, wherein the substrate comprises a first surface, a second surface opposite to the first surface, and a plurality of through holes; the first surface and the second surface are communicated by the plurality of through holes;
   wherein the positive section comprises a first metal section disposed on the first surface and a second metal section disposed on the second surface; the first metal section and the second metal section are electrically connected by one of the plurality of through holes;
   wherein the negative section comprises a third metal section disposed on the first surface and a fourth metal section disposed on the second surface; the third metal section and the fourth metal section are electrically connected by another one of the plurality of through holes;
   wherein the first metal section and the third metal section are mutually individual; the second metal section and the fourth metal section are mutually individual.

10. The packaging frame according to claim 7, wherein the substrate comprises a first surface, a second surface opposite to the first surface, and a plurality of through holes; the first surface and the second surface are communicated by the plurality of through holes;
   wherein the positive section comprises a first metal section disposed on the first surface and a second metal section disposed on the second surface; the first metal section and the second metal section are electrically connected by one of the plurality of through holes;

wherein the negative section comprises a third metal section disposed on the first surface and a fourth metal section disposed on the second surface; the third metal section and the fourth metal section are electrically connected by another one of the plurality of through holes;

wherein the first metal section and the third metal section are mutually individual; the second metal section and the fourth metal section are mutually individual.

11. The packaging frame according to claim 7, further comprising a lens; wherein the lens is disposed on the reflector of the packaging frame, connective layer is disposed between the lens and the reflector, and the connective layer is made of geological polymer.

12. A preparing method of a geological polymer applicable for a packaging frame, comprising:
    providing mixed powders whose principal raw materials are mineral powders with silicon oxygen tetrahedron and aluminum oxygen tetrahedron;
    adding an alkali activator into the mixed powders to form a slurry with fluidic and thixotropic properties; and
    disposing the slurry in a predetermined position of the packaging frame to react and solidify and thereby forming the geological polymer;
    wherein the packaging frame is configured for securing a photoelectric device chip and comprises:
        a lead frame comprising a positive electrode pad and a negative electrode pad;
        an insulator disposed between the positive electrode pad and the negative electrode pad; and
        a reflector disposed on the lead frame and the insulator, the reflector being formed with a through hole to define regions where the lead frame and the insulator are located in the through hole as a die bonding region, the reflector being connected with the lead frame by a connector, and the connector being made of the geological polymer;
    or, wherein the packaging frame is configured for securing a photoelectric device chip and comprises:
        a substrate;
        a metal layer disposed on the substrate and comprising a positive section and a negative section spaced apart; and
        a reflector disposed on the substrate and the metal layer, the reflector being formed with, a through hole to define regions where the metal layer and the substrate are located in the through hole as a die bonding region, the reflector being connected with the substrate by a connector, and the connector being made of the geological polymer.

13. The preparing method of a geological polymer according to claim 12, wherein partical size of the mineral powders is in a range from 3 μm to 45 μm.

14. The preparing method of a geological polymer according to claim 12, wherein the mixed powders further comprise reflective powders, and a weight ratio of the reflective powders in the mixed powders is in a range of 1.5%~25%.

15. The preparing method of a geological, polymer according to claim 14, wherein a solid content of the mixed powders in the slurry is in a range of 75~92 wt %.

16. The preparing method of a geological, polymer according to claim 12, wherein a solid content of the mixed powders in the slurry is in a range of 75~92 wt %.

17. The preparing method of a geological polymer according to claim 12, further comprising:
    providing a mold with a predetermined shape same as the packaging frame to hold the lead frame or the substrate of the packaging frame, and
    injecting the slurry into the mold to react and thereby form the reflector and the connector simultaneously.

* * * * *